United States Patent [19]

Cleeves

[11] Patent Number: 5,652,182
[45] Date of Patent: Jul. 29, 1997

[54] DISPOSABLE POSTS FOR SELF-ALIGNED NON-ENCLOSED CONTACTS

[75] Inventor: James M. Cleeves, Redwood City, Calif.

[73] Assignee: Cypress Semiconductor Corporation, Calif.

[21] Appl. No.: 581,061

[22] Filed: Dec. 29, 1995

[51] Int. Cl.⁶ .................................................. H01L 21/28
[52] U.S. Cl. .......................... 437/195; 457/192; 457/189; 457/231
[58] Field of Search ................... 437/189, 190, 437/192, 195, 231

[56] References Cited

U.S. PATENT DOCUMENTS

| | | | |
|---|---|---|---|
| 4,822,753 | 4/1989 | Pintchovski et al. | 437/192 |
| 4,960,732 | 10/1990 | Dixit et al. | 437/192 |
| 5,084,413 | 1/1992 | Fujita et al. | 437/192 |
| 5,183,782 | 2/1993 | Onishi et al. | 437/192 |
| 5,514,622 | 5/1996 | Bornstein et al. | 437/189 |
| 5,518,963 | 5/1996 | Park | 437/195 |

FOREIGN PATENT DOCUMENTS 2-101746  4/1990  Japan .

Primary Examiner—John Niebling
Assistant Examiner—Thomas G. Bilodeau
Attorney, Agent, or Firm—Blakely, Sokoloff, Taylor & Zafman, LLP

[57] ABSTRACT

A disposable post process for contact openings to interconnect material of reduced geometry and no enlarged landing pads is disclosed. A layer of material is formed over interconnect regions on a semiconductor wafer and subsequently patterned into posts which define the location and shape of openings to be formed in a subsequently formed planar layer. After a layer is formed to surround the posts, the posts are removed to create openings in the layer above underlying interconnect regions. These openings may then be used to form suitable contacts to the interconnect regions.

22 Claims, 7 Drawing Sheets

DISPOSABLE POSTS FOR SELF-ALIGNED NON-ENCLOSED CONTACTS

FIELD OF THE INVENTION

The invention relates generally to the field of semiconductor device fabrication and more particularly to the field of forming openings in a layer for semiconductor device fabrication.

BACKGROUND OF THE INVENTION

In the fabrication of semiconductor devices, numerous conductive device regions and layers are formed in or on a semiconductor substrate. The conductive regions and layers of the device are isolated from one another by insulating layers or dielectric. Examples of dielectrics include silicon dioxide, $SiO_2$, tetraethyl orthosilicate glass ("TEOS"), silicon nitrides, $Si_xN_y$, silicon oxynitrides, $SiO_xN_y$, silicon dioxide/silicon nitride/silicon dioxide ("ONO"), and spin on glass ("SOG"). The dielectrics may be grown, or may be deposited by physical deposition (e.g., sputtering) or by a variety of chemical deposition methods and chemistries (e.g., chemical vapor deposition ("CVD")). Additionally, the dielectrics may be undoped or may be doped, for example with boron, phosphorous, or both, to form, for example, borophosphosilicate glass ("BPSG"), phosphosilicated glass ("PSG"), and borophosphosilicate tetraethyl orthosilicate glass ("BPTEOS").

At several stages of the fabrication of semiconductor devices, it is necessary to make openings in the dielectric to allow for contact to underlying regions or layers. Generally, an opening through a dielectric exposing a diffusion region or an opening through a dielectric layer between polysilicon and the first metal layer is called a "contact opening", while an opening in other oxide layers such as an opening through an intermetal dielectric layer is referred to as a "via". The opening may expose a device region within the silicon substrate, such as a source or drain, or may expose some other layer or structure, for example, an underlying metallization layer, local interconnect layer, or structure such as a gate. For purposes of the claimed invention, "contact opening" as used herein refers to both contact openings and via. After the contact opening has been formed exposing a portion of the region or layer to be contacted, the opening is generally cleaned with a sputter etch, e.g., a Radio-Frequency ("RF") sputter etch, and then the opening is filled with a conductive material deposited in the opening and in electrical contact with the underlying region or layer.

To form the openings a patterning layer of photoresist is first formed over the dielectric layer having openings corresponding to the regions of the dielectric where the openings are to be formed. In most modern processes a dry etch is then performed wherein the wafer is exposed to a plasma, formed in a flow of one or more gases. Typically, one or more halocarbons and/or one or more other halogenareal compounds are used as the etchant gas. For example, $CF_4$, $CHF_3$ (Freon 23), $SF_6$, $NF_3$, and other gases may be used as the etchant gas. Additionally, gases such as $O_2$, Ar, $N_2$, and others may be added to the gas flow. The particular gas mixture used will depend on, for example, the characteristics of the dielectric being etched, the stage of processing, the etch tool being used, and the desired etch characteristics, i.e., etch rate, sidewall slope, anisotropy, etc.

Circuit elements (i.e., transistors, resistors, diodes, capacitors, etc.) are conductively linked through an interconnect or a series of interconnects through the contact openings or via through dielectric layers to an active region of an element, for example a source or drain. A conductive material or plug is deposited in the contact opening so that the conductive material or plug is electrically linked to the circuit element, and extends through the opening or via to the interconnect. The interconnects are metal (usually aluminum or titanium) and are formed by depositing a layer of the metal on the entire top surface portion of a wafer, and etching the metal to form the desired architecture that serves as the conductors between the various elements of each integrated circuit. In multilayer integrated circuits, multilayer interconnects are used to interconnect the various elements. Multilayering the interconnects maximizes the number of interconnects per unit area and reduces die size.

Modern integrated circuit structures strive to minimize the feature size of the structure to increase device processing performance and reduce production costs. The significant reduction in the size of the device features requires that contact holes be positioned close together, be of small diameter, and have steep vertical sidewalls. The size and shape of these contact holes makes it difficult to deposit conventional materials (i.e., aluminum) in the holes such that a uniform contact with the underlying conductive region or layer is established and no breaks occur in the interconnect metallization at the edges of the holes. This is partially overcome in the prior art by filling, for example, the contact holes with a separate plug fill material such as tungsten and then depositing an aluminum metallization over the plug to form an interconnect (see for example U.S. Pat. Nos. 4,822, 753 and 4,960,732). A second method includes the deposition of tungsten plug fill material over an underlying conductive film (e.g., titanium, titanium-nitride, titanium-tungsten, etc.) and the deposition of an additional conductive layer (e.g., titanium, titanium-nitride, titanium-tungsten, aluminum, etc.) over the plug and patterned to form an interconnect between via plugs. A third method is the use of tungsten for both the plug fill material and the interconnect wiring layer (see for example U.S. Pat. Nos. 4,940,732 and 5,183,782). A fourth method utilizes an adhesion layer comprising the deposition of titanium within a contact hole, a barrier layer of a refractory metal, deposition and selective etch-back of tungsten, and a subsequent overlying aluminum metallization (see for example U.S. Pat. No. 4,960,732).

A fifth method of making interconnects with increased speed, no interface barriers, and minimal disruption of the planarity of the semiconductor device is a titanium, titanium-tungsten or -nitride, tungsten contact/interconnect described in the patent application of Jonathan Bornstein and Roger Caldwell, titled "A Method for the Formation of Interconnects and Landing Pads Having a Thin, Conductive Film Underlying the Plug of an Associated Contact or Via Hole", and filed Aug. 29, 1994, given Ser. No. 08/297,626, now U.S. Pat. No. 5,514,622, and assigned to Cypress Semiconductor, Inc., incorporated herein by reference. FIG. 1 illustrates the contact and interconnect described in the referenced application. FIG. 1 shows a cross-sectional planar side view of a portion of a silicon substrate having at least one device region 110 formed at the surface of the substrate. A first insulating layer 120 is deposited over the substrate having a contact hole 130 formed through the insulating layer to expose the device region. A first blanket layer of titanium 140 is deposited as a tungsten adhesion layer over the insulating layer and the exposed device region within the contact hole, this adhesion layer 140 being formed to a thickness of approximately 1,400 Angstroms (Å). A second blanket layer 150 of titanium-tungsten or titanium-nitride is then deposited as a tungsten barrier layer over the adhesion layer. This barrier layer 150 preferably comprises a thickness of approximately 800 Subsequently, a blanket contact plug layer 160 comprising tungsten is deposited to a preferred thickness of approximately 8,000 Å over the barrier layer by chemical vapor deposition.

Both the contact plug layer 160 and the barrier layer 150 are then removed from the surface of the adhesion layer everywhere except within the contact hole 130 by a selective etch back process wherein a selectivity between tungsten and titanium of at least 5:1 is achieved. This is accomplished by use of a SF6 gas chemistry and etch parameters comprising a gas flow of 100 to 300 sccm, a chamber pressure of 200 to 400 mTorr, a 13.56 RF power of 350 to 550 Watts and a chamber temperature of 30° to 50° Celsius. Next, the exposed portions of the titanium adhesion layer 140 are patterned with a mask and etched to remove those portions of the adhesion layer 140 not covered by the mask, thus converting the adhesion layer 140 into a thin film interconnect having a thickness of approximately 1,000 Angstroms and underlying the contact plug of the associated contact hole. Although it has been described as an adhesion layer, it should also be noted that titanium provides good electrical contact and acts as an etch stop for the plasma etching of tungsten.

A still further method of making interconnects is by a Damascene process. Briefly, the Damascene process involves creating a trench adjacent to the contact hole and along an interconnect line. The contact hole and trench are filled, for example, as in the previous method, with a titanium adhesion layer, a titanium-tungsten or -nitride barrier layer, and a tungsten blanket layer. In the Damascene process, the tungsten blanket layer in the trench is the interconnect and forms the contact with an overlying conductive material.

Referring back to the titanium, titanium-tungsten or -nitride, tungsten contact/interconnect process described above and illustrated in FIG. 1, a typical device process will overlay the structure shown in FIG. 1 with a second insulating layer. FIG. 2 illustrates the deposition of a second planarized insulating layer 220 and the opening of the insulating layer 220 to form a second contact hole 230 above the interconnect 240. The second contact hole 230 is formed by etching the second insulating layer 220 whereby a second contact hole 230 is exposed above the interconnect 240. To compensate for misalignment and to assure that electrical connection between the interconnect 240 and a subsequent contact in the second contact hole 230, the over etch of the exposed interconnect 240 region must be large to account for the uniformity of the equipment.

The result of this large, thorough over etch to assure the exposure of the interconnect is that the underlying first insulating layer is gouged in the area not covered by the interconnect. The gouge or trench 250 occurs because the selectivity of the second insulating layer 220 etch cannot limit the etch to the removal of only second insulating layer material (typically an oxide material), but inevitably involves the etching of the first insulating layer 210 (typically, also an oxide material) that is unprotected by interconnect. In other words, the second insulating layer 220 is selective in that it will etch insulating material and not interconnect material, but will also continue beyond the second insulating layer 220 and etch the first insulating material in the contact area where there is an absence of interconnect material. The gouge or trench 250 created is undesirable because the gouge 250 can fill with contaminants that will shorten the life of the integrated circuit.

To avoid the resultant gouge or trench and possible contamination, the prior art creates "enlarged landing pads" of the interconnect material. An enlarged landing pad is an enlarged portion of the interconnect material that is designed to assure contact with the contact material and protect against gouging. To compensate for misalignment and to avoid the creation of a gouge or trench, an enlarged landing pad is usually created by patterning with a mask and etching the interconnect material. The connection point (or landing pad) between the contact and the interconnect is made to extend to the furthest point of potential misalignment of the contact hole given the process margin, i.e., the enlarged landing pad occupies the largest possible surface area that a subsequent contact may contact plus an additional area to serve as an etch-stop layer to prevent gouging. FIG. 3 presents a top plan view of a device with two interconnects 310, 315 with enlarged landing pads 320, 325 overlying a first insulating layer. FIG. 3 is not drawn to the same scale as FIG. 2 so that the enlarged landing pads of the prior art may be clearly illustrated. The enlarged landing pads 320, 325 occupy considerably more surface area than the interconnect lines 310, 315. For clarity purposes a second insulating layer is not shown over the interconnects 310, 315. In FIG. 3, interconnect 310 is electrically linked to the first contact opening 330. A second contact opening 340 (shown in ghost lines) for an upper layer interconnect is made to the landing pad 320 of interconnect 310.

The size of prior art enlarged landing pads is proportional to the device technology utilized. For example, with 0.5 µm technology, the contact opening is approximately 0.5 µm which means that the interconnect material need be only 0.5 µm wide to be in complete contact with conductive material in the contact opening. However, because of alignment tolerances and to avoid the creation of the gouge or trench, prior art processes typically add at least an additional 0.25 µm to each side of the contact point of the interconnect to create an enlarged landing pad of interconnect material.

The eventual size of the landing pad of the interconnect is directly related to the spacing of active structures on an integrated circuit. In other words, the spacing requirement mandated by the need for a significant landing pad limits the density of the device being fabricated as the contact openings must be safely constructed so as not to allow the introduction of contaminants into the structure by an unwanted gouge or trench. Enlarged landing pads with enlarged surface areas reduce the number of interconnects that may be placed in a given location on a device.

There is a need for a process to create and electrically link interconnects of reduced geometry with overlying contact structures. The reduced geometry interconnects must be part of a process whereby the insulating layer over which the interconnects lie is not gouged. Finally, there is a need for simpler interconnect-contact formation process that maximizes device space.

SUMMARY OF THE INVENTION

The invention advantageously simplifies typical interconnect-contact formation processes for semiconductor device fabrication by eliminating the need to use an etch through the insulating layer to create contact openings to interconnects. By eliminating the etch, the invention also provides for a way to decrease spacing requirements and increase device density by eliminating the need to have enlarged interconnect landing pads.

In accordance with the invention, a thin film layer of interconnect material, for example titanium, is etched to a minimum reduced geometry and no or minimal landing pad area. Next, a first material is formed over a semiconductor wafer and over the interconnect material. The first material may contain a photosensitive material, polysilicon, or other material. This first material layer is patterned to form a post over the interconnect material. A layer of a second material is formed over the wafer and around the post. Where necessary, an etch-back, chemical-mechanical polish, or melt-flow process is performed to expose the post. The post is removed to form an opening in the second material layer. The opening in the second material layer may be filled with a third material. The second material may contain an insulative material while the third material may contain a conductive material. The first material may be patterned by etching the first material to form the post. Also, the second material may be planarized.

The process steps of forming a preliminary post of photosensitive material, polysilicon, or other material permits the use of a highly selective etch between the post material and the second material layer and the material layer underlying the interconnect. The process yields an opening in the second material layer to interconnect material without the risk of gouging the material layer underlying the interconnect. Without the risk of gouging or trenching, the interconnect may be made of reduced geometry which, in turn, increases the device density of a given wafer.

While the above advantages of the invention have been described, other attendant advantages, objects, and uses of the invention will become evident to one of ordinary skill in the art based on the following detailed description of the invention with reference to the accompanying drawings.

BRIEF DESCRIPTION OF THE DRAWINGS

The invention is illustrated by way of example and not limitation in the figures of the accompanying drawings in which like references indicate similar elements and in which:

FIG. 3 is not drawn to the same scale as FIG. 2.

FIG. 5(b) is not drawn to the scale of the planar side view of FIG. 5(a).

FIG. 5(h) is not drawn to the scale of the planar side views of FIGS. 5(a)–5(g).

DETAILED DESCRIPTION OF THE INVENTION

A specific embodiment or embodiments in accordance with the invention for disposable post processing for semiconductor device fabrication is described. In the following description, numerous specific details are set forth such as specific thicknesses, materials, processing sequences, deposition methods, semiconductor devices, etc., in order to provide a thorough understanding of the invention. It will be evident, however, to one of ordinary skill in the art that the invention may be practiced without these specific details. In other instances, well-known processing steps, equipment, etc., have not been described in particular detail so that the invention is not unnecessarily obscured.

Figure 1:
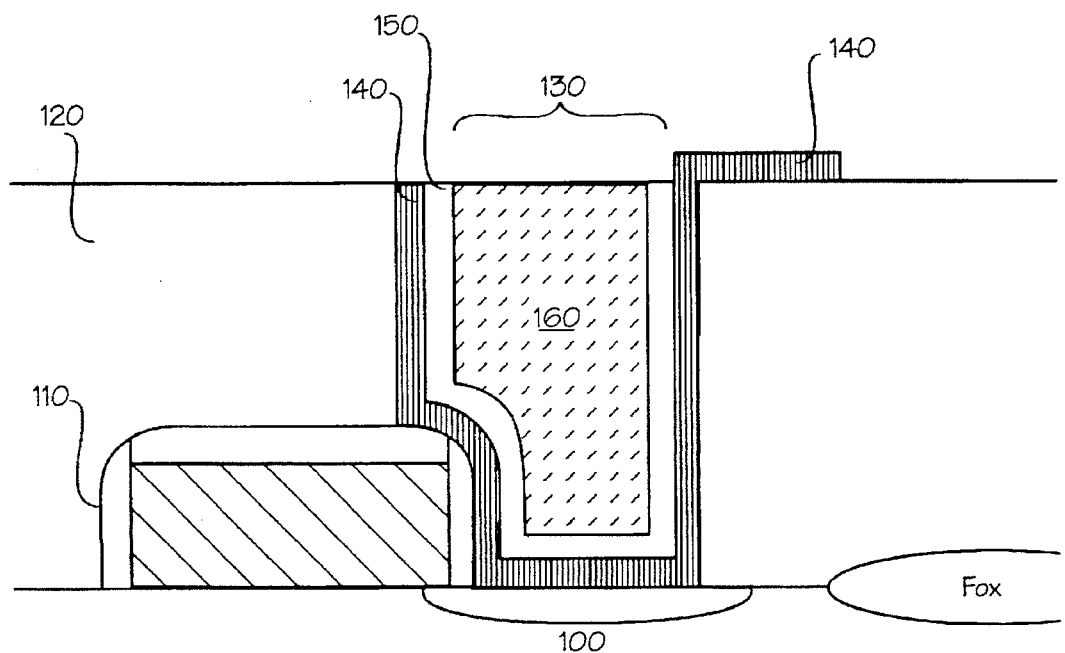
FIG. 1 is a cross-sectional planar side view of a portion of a semiconductor substrate with a MOS transistor and a contact with an interconnect region extending from the contact region and overlying an insulating layer.
Figure 2:
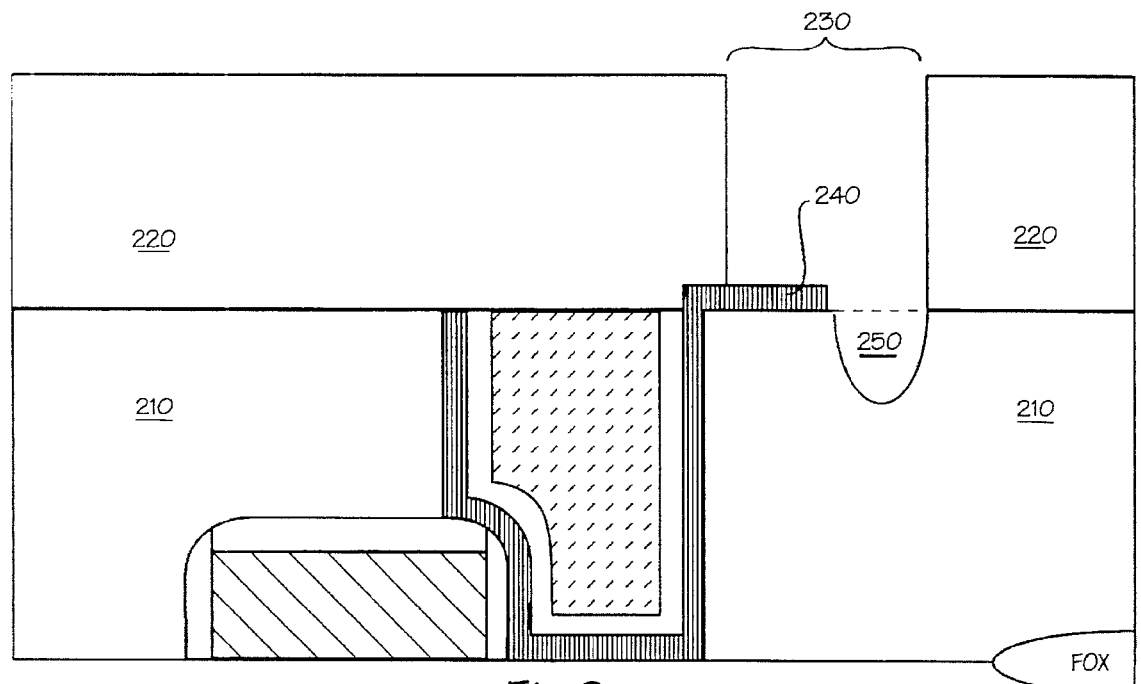
FIG. 2 is a cross-sectional planar side view of a portion of a semiconductor substrate with a MOS transistor, a contact with an interconnect region, and a first and second insulating layer overlying the structure and wherein a contact opening has been opened in the second insulating layer by an etch that also created a gouge or trench in the underlying first insulating layer.
Figure 3:
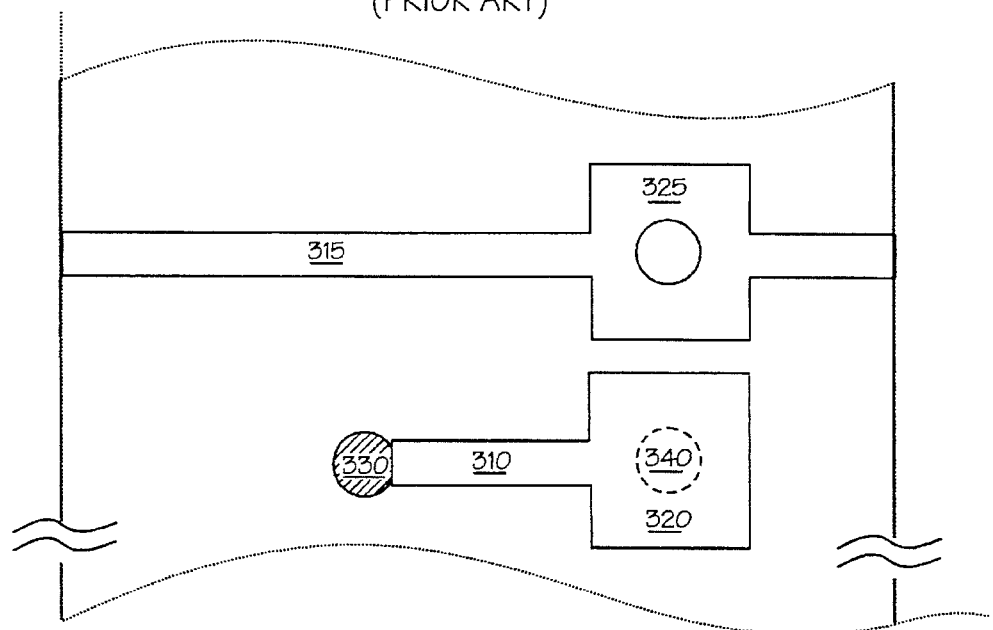
FIG. 3 is a planar top view of a portion of a prior art semiconductor substrate with a contact opening in an insulating layer and two interconnect lines each interconnect line having a landing pad of maximum surface area to avoid over-etching into the underlying insulating layer when subsequent contact openings are formed to the landing pads.
Figure 4:
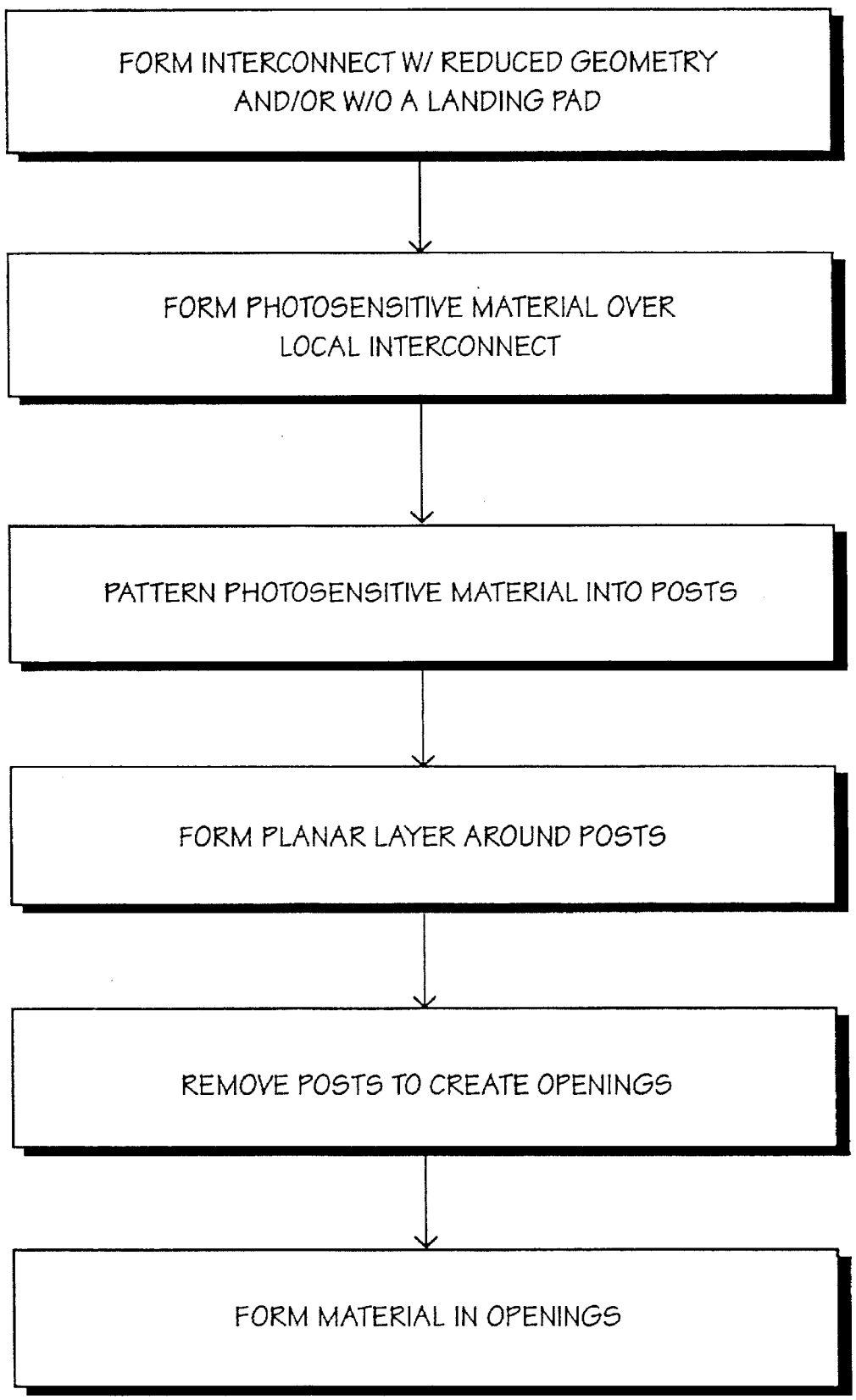
FIG. 4 is a flow chart of an exemplary method for disposable post processing for creating contact openings to interconnect regions of reduced geometry.
Figure 5A:
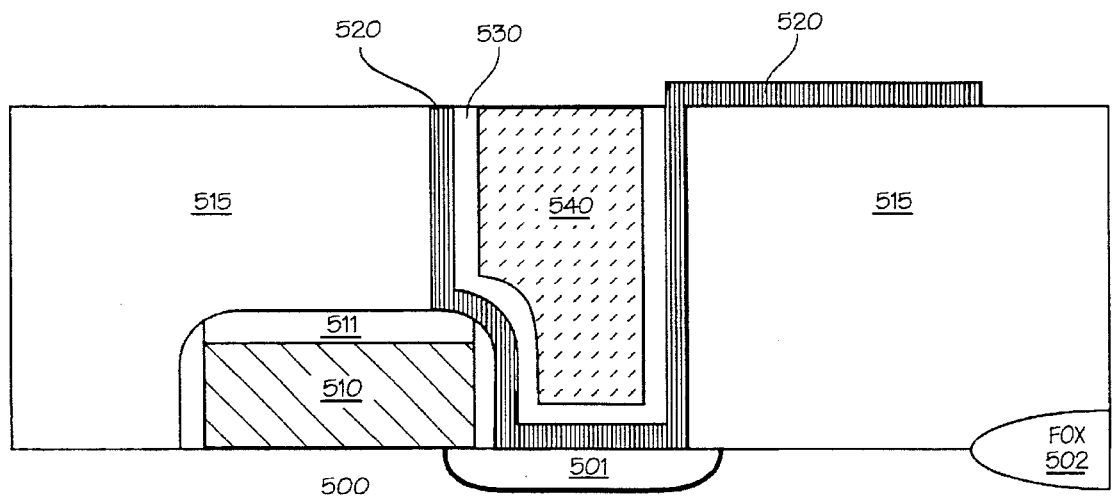
FIG. 5(a) is a cross-sectional planar side view of a portion of a semiconductor substrate with a MOS transistor and a contact with an interconnect region extending from the contact region and overlying an insulating layer wherein the interconnect region has a reduced geometry.

FIG. 4 illustrates, in the form of a flow diagram, an exemplary method for disposable post processing for semiconductor device fabrication in accordance with the invention. So as to better explain the method of FIG. 4, FIGS. 5(a)–5(h) will be used to illustrate the steps performed in the method of FIG. 4. For the disposable post processing of the semiconductor wafer partially illustrated in FIGS. 5(a)–5(h), a semiconductor substrate is provided, as illustrated in FIG. 5(a), by substrate 500. This substrate 500 may be a silicon substrate, yet it is to be appreciated that a variety of other types of semiconductor substrates may be used, for example, depending upon one's specific design and/or functional requirements for the semiconductor device to be fabricated.

Regardless of the type of substrate, various processing steps may be performed prior to the disposable post process in accordance with the invention. For example, various isolation structures and semiconductor devices may be formed over the substrate prior to the disposable post process in accordance with the invention, as illustrated in FIG. 5(a) where diffusion region 501, field oxide region 502, and a MOS transistor including a polycrystalline silicon (polysilicon) gate 510 surrounded by an outer insulative silicon dioxide ($SiO_2$) layer 511 have been formed. Overlying the MOS transistor is a first insulating layer 515. The insulating layer 515 may be any dielectric, for example $SiO_2$, TEOS, $Si_xN_y$, $SiO_xN_y$, SOG, ONO, and may be doped, for example, BPSG, PSG, and BPTEOS.

The substrate 500 shown in FIG. 5(a) contains a contact opening. The contact opening is filled with conductive material comprising a blanket layer of titanium 520, deposited as a tungsten adhesion layer, to a thickness of approximately 1400 Å, a blanket layer 530 of titanium-tungsten or titanium-nitride of approximate thickness of 800 Å, and a blanket contact plug layer 540 comprising tungsten of a thickness of approximately 8000 Å.

A selective etch back process removes the contact plug layer 540 and the blanket layer 530 from the surface of the titanium blanket layer 520 everywhere except within the contact opening. A selective etch, wherein the selectivity between tungsten and titanium is at least 5:1, is an SF6 gas chemistry and etch parameters of a gas flow of 100 to 300 sccm, a chamber pressure of 200 to 400 mTorr, a 13.56 RF power of 350 to 550 Watts and a chamber temperature of 30° to 50° Celsius. Next, the exposed portions of the titanium blanket layer 520 are patterned with a mask and etched to remove those portions of the blanket layer 520 not covered by the mask. The first blanket layer of titanium 520 extends from the contact hole to form an interconnect structure adjacent to the contact hole with a final thickness of 1000 Å.

Figure 5B:
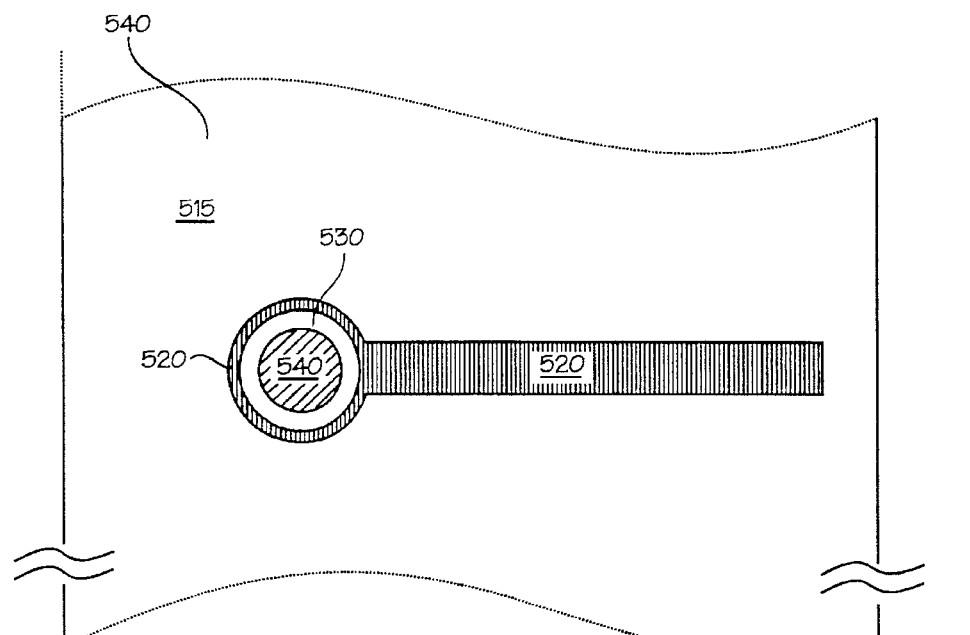
FIG. 5(b) is a planar top view of the semiconductor substrate of FIG. 5(a) with a contact opening in an insulating layer and an interconnect line of reduced geometry overlying an insulating layer.

FIG. 5(b) illustrates a top plan view of the device shown in FIG. 5, wherein a contact hole is filled with a first blanket layer of titanium 520, a second blanket layer 530 of titanium-tungsten or titanium-nitride and a blanket contact plug layer 540 of tungsten formed in a first insulating material 515 that overlies a MOS transistor. FIG. 5(b) is not drawn to the scale of the planar side view of FIG. 5(a). Referring to FIG. 5(b), the first blanket layer of titanium 520 is extended as an interconnect from the contact hole over the first insulating layer 515. The first blanket layer of titanium 520 is patterned using standard photolithography techniques with an interconnect mask pattern. After the resist is patterned, this layer is etched using conventional plasma etching equipment to form the interconnect of the invention. The invention contemplates that the dimensions of the interconnect 520 layer can be minimized and no associated landing pad be created out of interconnect material to later connect with a contact. The invention contemplates that the area occupied by the interconnect 520 is of a reduced geometry with no additional interconnect material (i.e., no enlarged landing pad) included to avoid the risk of a gouge. With 0.5 μm technology and relaxed process control, for example, the maximum interconnect material contemplated by the invention is equal to the diameter of the contact opening, or in the range of 0.4–0.6 μm at a minimum printable linewidth.

Figure 5C:
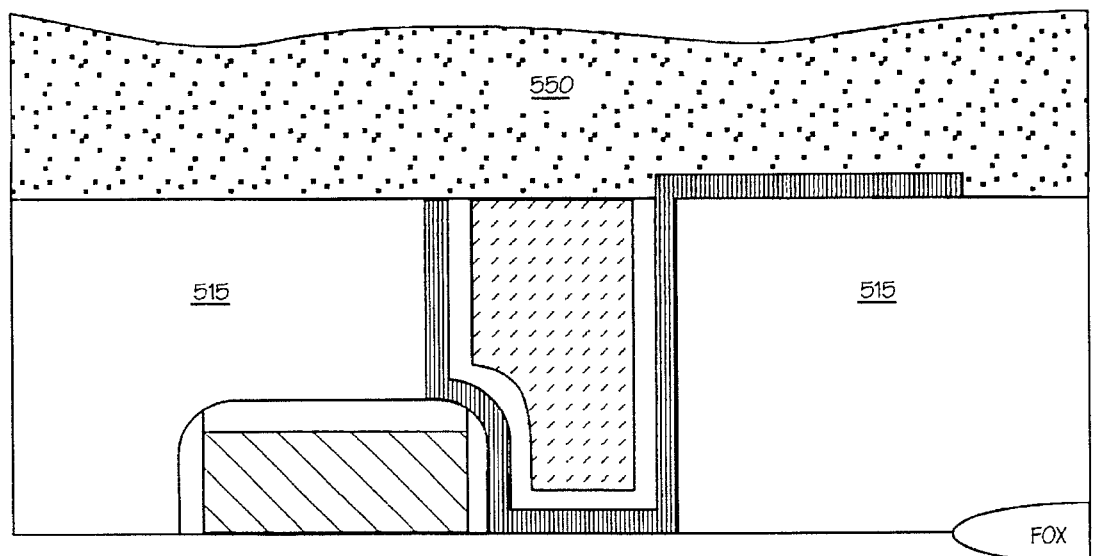
FIG. 5(c) is a cross-sectional planar side view of the semiconductor substrate of FIGS. 5(a) and 5(b) after the formation of a photosensitive material in accordance with the invention.

FIG. 5(c) illustrates a cross-sectional planar side view of the subsequent process step of the invention. To the semiconductor substrate, that includes the MOS transistor and the contact with an interconnect of reduced geometry and no enlarged landing pad, is deposited a photosensitive material 550. This photosensitive material 550 may include for example photoresist or a photosensitive polyimide. The photosensitive material 550 coated over the structure preferably has a thickness which accounts for the highest topology of the wafer, any minimum insulation thickness needed over the wafer's topology, and optionally an etch-back margin as this photosensitive material 550 may later be etched as will be discussed below. For example, in coating the photosensitive material 550 over the structure illustrated in FIG. 5(c), the thickness of photosensitive material 550 is greater than the thickness of an eventual contact that will reside in a second insulating or dielectric layer above the substrate plus an optional etch-back margin to account for subsequent etching. While in this example, photosensitive material 550 may be approximately 10,000 Å in thickness, other thicknesses may also be used.

Figure 5D:
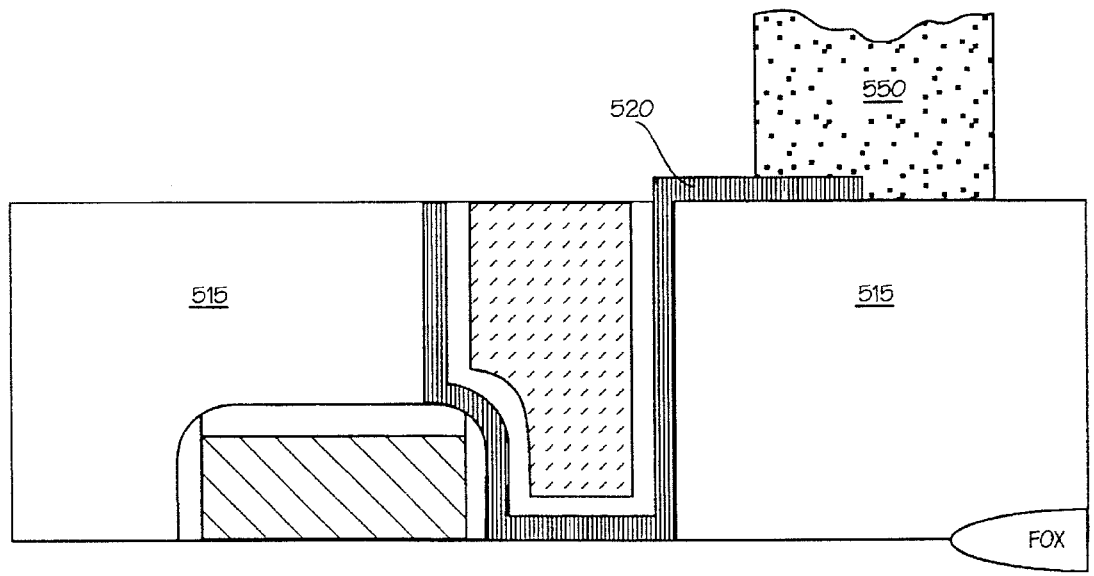
FIG. 5(d) is a cross-sectional planar side view of the semiconductor substrate of FIG. 5(c) after the photosensitive material has been patterned to form a post in accordance with the invention.

Referring to FIG. 5(d), the photosensitive material 550 is patterned into posts above the underlying interconnect material 520. Alignment of the post is accomplished using conventional alignment techniques practiced by those of ordinary skill in the art. The photosensitive material 550 is patterned into posts by the exposure of radiation, for example ultra-violet (UV) light, through a mask and by the subsequent development of the photosensitive material 550. In one embodiment, where the photosensitive material 550 contains photoresist, a negative tone mask or an image reversal process using a positive tone mask may be used. Furthermore, the profile or cross-section dimension of the posts may be varied, for example, by controlling the exposure energy when exposing the photoresist through the mask. After being patterned, these photoresist posts are preferably cured using a deep UV light exposure to harden the photoresist in the posts. Here, the polymers in the photoresist will become cross-linked during the deep UV cure so as to prevent the photoresist posts from later flowing or shrinking when exposed to elevated temperatures. As will be seen below, this may be needed in order for the posts to withstand subsequent processing steps.

The photosensitive material 550 is patterned such that the remaining photosensitive material after development defines the desired shapes and locations of openings for a layer to be formed over the surface of the structure. In other words, the photosensitive material 550 is patterned to define posts whose subsequent removal will create openings in an overlying layer formed over the interconnect material 520, so that appropriate contacts to interconnects may be formed. In the illustration of FIG. 5(d), photosensitive material 550 has been patterned to form a post over interconnect 520 so as to later form a contact opening in an insulating layer to be formed over the first insulating layer 515. With this contact opening, a contact may later be formed to provide for electrical connection to the underlying interconnect 520. It is to be appreciated that the posts may be of any shape and that the term "post" is not meant to be limited in meaning but rather includes, for example, any material used to define the location, size, and shape of openings for a subsequently formed layer. For example, the term "post" encompasses long, thin lines to form long, thin openings and large blocks to form large openings, like 100 μm bond pad openings.

Figure 5E:
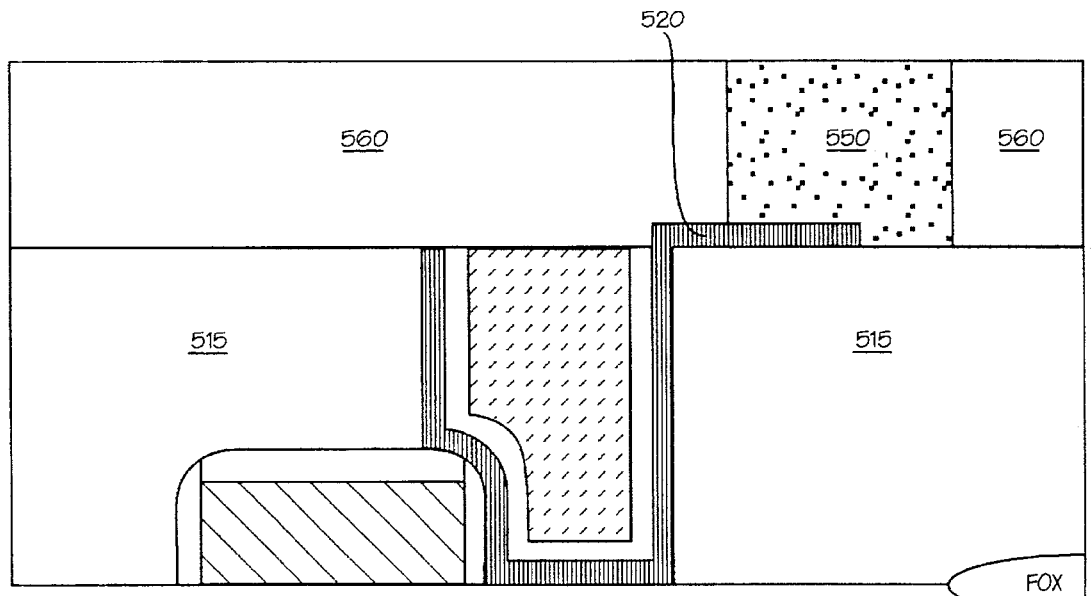
FIG. 5(e) is a cross-sectional planar side view of the semiconductor substrate of FIG. 5(d) where a layer has been formed around the post in accordance with the invention.

Referring to FIG. 5(e), a layer 560 is formed around the posts of photosensitive material 550 over the interconnect 520. The layer 560 is preferably planarized. The planar layer 560 may be an insulative layer formed, for example, by forming a CVD silicon dioxide ($SiO_2$), SOG, silicon nitride ($Si_3N_4$), borophosphosilicate glass (BPSG), a low-temperature oxide (LTO) an oxynitride, a polyimide or any other suitable dielectric material using suitable methods. Such an insulative layer may be multilayered by using a combination of two or more layers of suitable dielectric materials. It is to be appreciated that the formation of the layer which is to surround the posts as well as any etch-back, polishing, and/or reflow of the overlying layer may involve heating the substrate to elevated temperatures. Accordingly, where the photosensitive material 550 used to create the posts contains photoresist, the posts have been preferably hardened as discussed above using a deep UV cure so as to preserve the posts during such processing steps. Furthermore, the thickness of the planar layer 560 surrounding the posts may be of any thickness depending, for example, on any electrical isolation needed between an underlying layer and a layer to be subsequently formed, any structural requirements, or the amount required to provide planarization as well as any other design or functional requirements. For mechanical reasons, a planar layer of deposited oxide that is to be polished (e.g., BPSG, TEOS, etc.) must be as thick as the post is tall. Further, in order to remove the post, it is to be appreciated that at the end of the insulative layer 560 deposition, planarization, and etchback, polishing, or reflow processes, the layer 560 cannot be thicker than the height of the post.

In one embodiment, a spin-on glass (SOG) layer is first formed over the interconnect and subsequently cured, for example, at approximately 350° Celsius, as is required to withstand subsequent polishing. This first SOG layer is preferable since it is spun-on as a liquid and hence, thoroughly fills and covers the surface of the substrate. Where photoresist posts are used, the first SOG layer is then post-baked, for example, at approximately 350° Celsius or other suitable temperatures so that the first SOG layer may withstand subsequent polishing. It is to be appreciated that curing the SOG layer at elevated temperatures at or beyond approximately 400° Celsius may cause shrinkage of photoresist posts. If, however, a subsequent chemical-mechanical polish (as described below) will not be used to remove the post, the SOG may be baked to temperatures of 800° Celsius with a photoresist post. The elevated temperatures will cause the photoresist post to shrivel and shrink but the SOG will retain its shape. The shrunken post can then be removed with a conventional etch. If a chemical-mechanical polish will be used to expose the post (as described below), care must be used to not bake the SOG at temperatures that will cause the post to shrink and allow polish slurry to get into the contact opening where it will be difficult to remove. Once the SOG is down and cured, an optional silicon dioxide layer can be deposited over the first SOG layer using a plasma-enhanced chemical vapor deposition (PECVD). Alternatively, the silicon dioxide may be put down first, followed by the SOG layer.

Once the layer 560 to surround the posts has been formed, the layer may be planarized using suitable methods, for example, with a planarizing etch-back, flowable SOG, or polishing technique. In one embodiment, polishing may be performed using a chemical-mechanical polishing (CMP) technique where a slurry with a chemistry including a colloidal silica may be used. Care must be taken not to destroy or knock the post material off the substrate. Thus, the initial stages of the polish must be conducted at a low pressure, i.e., 1–2 psi at the back of the wafer. In planarizing the overlying layer that surrounds the posts, the posts are preferably also planarized and exposed at the surface of the wafer so as to facilitate their later removal from the planar layer 560. Where, however, the planar layer 560 surrounding the posts is, for example, spun-on or reflown, a planarizing etch-back or polishing may not be necessary as the surface of the overlying layer may already be planar. Preferably, any residue formed over the posts, though, is removed so as to facilitate the posts' later removal from the planar layer 560. For example, in the embodiment discussed above where a SOG is used to form the overlying planar layer 560, a fluorine-based plasma oxide etch may be used to remove any residue from the SOG formation that remains over the top of the posts. In this manner, the substrate's surface remains planar while the posts may be exposed for later removal. Furthermore, it is to be appreciated that where the overlying layer is spun-on, reflown, or is otherwise planar, the formation of the photosensitive material 550 used to create the posts may not need to account for the etch-back margin discussed above with regard to the thickness of the photosensitive material 550 provided the process exposes the posts for subsequent removal.

Figure 5F:
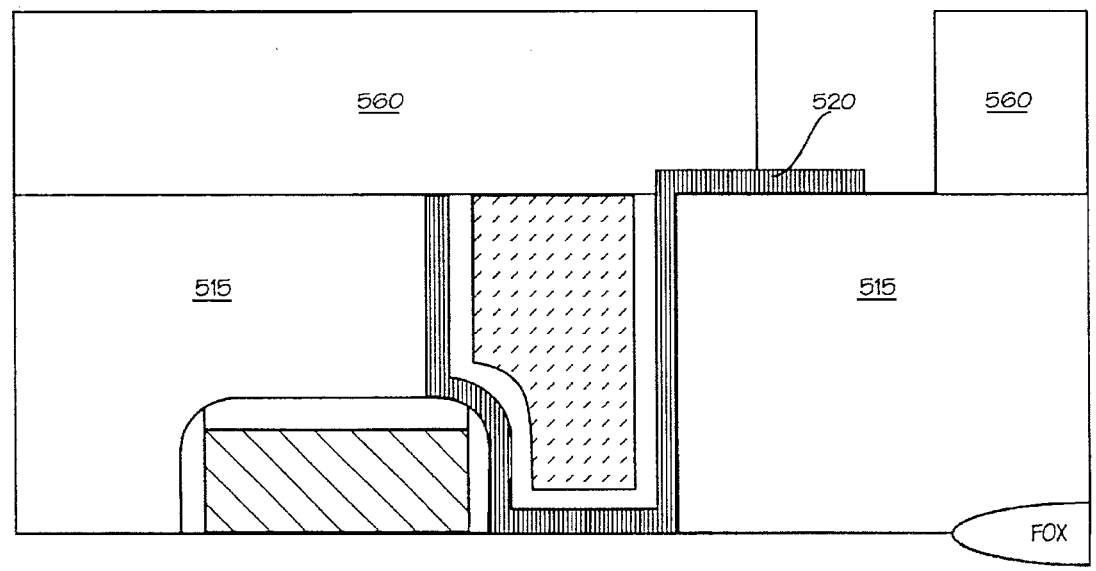
FIG. 5(f) is a cross-sectional planar side view of the semiconductor substrate of FIG. 5(e) where the post has been removed to create an opening in accordance with the invention.

Referring to FIG. 5(f), the posts of photosensitive material 550 are removed leaving respective openings throughout the planar layer 560. The technique used to remove the posts may depend on the material used for the posts as well as that used for the overlying planar layer 560. Preferably, the technique used to remove the posts causes little if any damage to the underlying surface, such as ion damage which may increase the resistance of the contacts formed in the openings. Furthermore, this technique preferably does not create any unwanted polymer formations that may have to be cleaned out of the openings. Where photoresist is used to create the posts, the posts may be, for example, ashed out using an oxygen plasma etch, etched out using a sulfuric acid, or dissolved using organic solvents. Such techniques will not damage the underlying substrate and will not form unwanted polymers in the openings.

The dielectric layer beneath the interconnect material is not damaged in the invented process when the post is removed, because the selectivity of the etch to remove the photosensitive material 550 that comprises the post is great as compared to its ability to etch the underlying oxide layer and underlying conductor layer.

It is to be appreciated that where the posts contain photoresist, the planar layer 560 may be finally cured following the removal of the posts. For example, in the embodiments discussed above where a SOG layer and a doped TEOS silicon dioxide layer are used to form the planar layer 560 and where SOG is used to form the planar layer 560, these layers may be finally cured at approximately 700° Celsius, although other temperatures may be used.

Figure 5G:
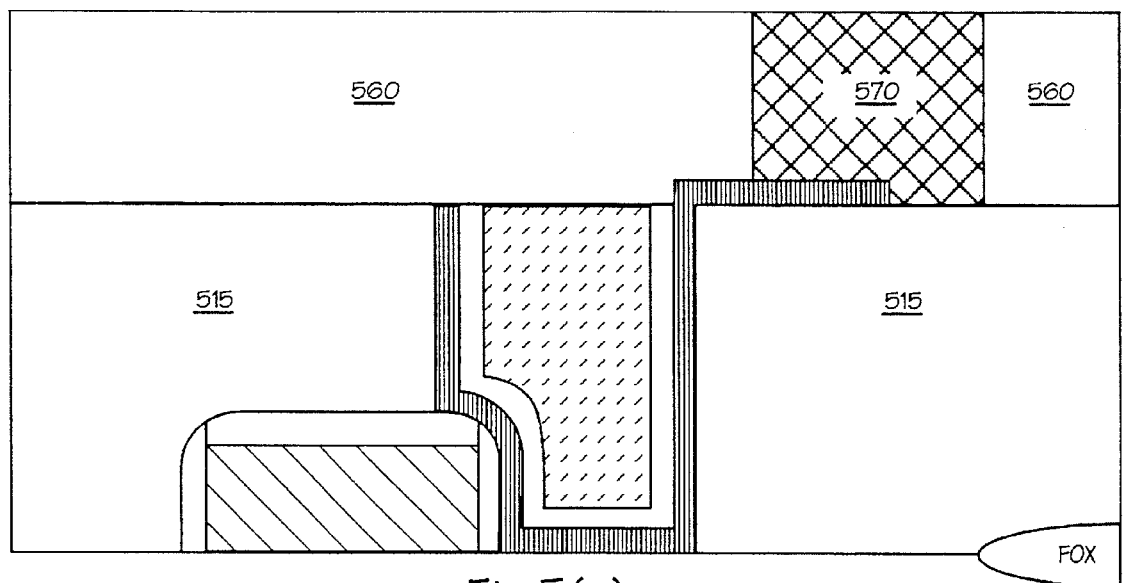
FIG. 5(g) is a cross-sectional planar side view of the semiconductor substrate of FIG. 5(f) where the opening is filled with a conductive material in accordance with the invention.

FIG. 5(g) illustrates the structure where a conductive material 570 is formed in the openings created by the removal of the post of photosensitive material. For example, the openings may be filled to create appropriate contacts or interconnect lines using a blanket CVD tungsten deposition and etch-back process to fill the openings. Other methods as well as other suitable conductive materials, for example aluminum and polysilicon, may also be used to form suitable contacts. It is to be appreciated that the openings do not have to be completely filled to create suitable contacts to the underlying interconnects but rather any suitable conductive material may be formed in the opening so long as electrical connection is provided to the underlying interconnects. For example, if some of the contact material is lost due to etching an upper layer interconnect line over the contact, the contact opening is not completely filled but a suitable contact is made provided there is an electrical connection to the underlying lower layer interconnect.

Figure 5H:
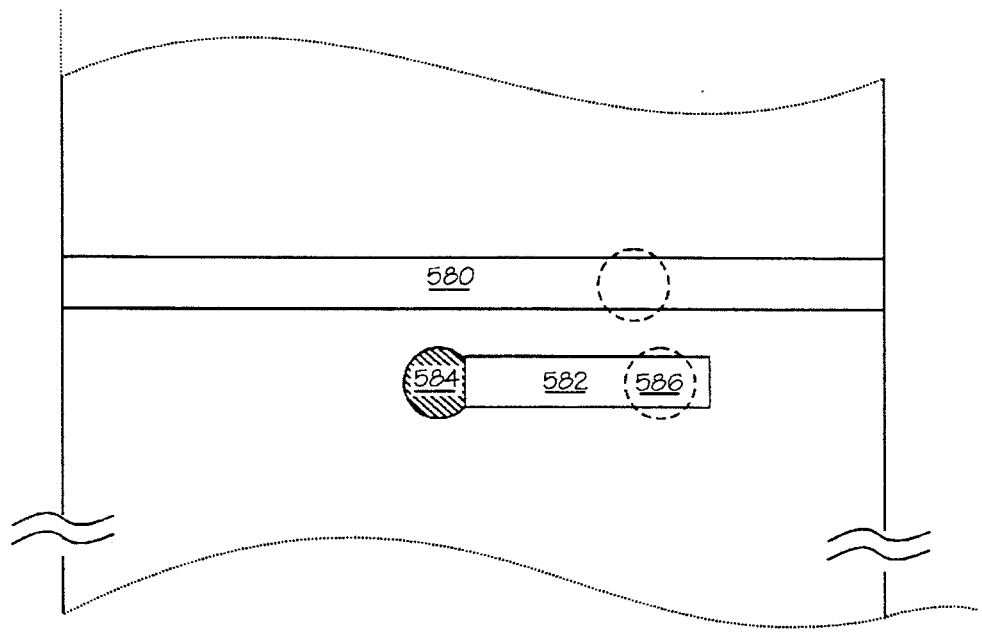
FIG. 5(h) is a planar top view of a portion of a semiconductor substrate wherein two interconnect lines of reduced geometry lie adjacent to one another to demonstrate the increased device density resulting from the process in accordance with the invention.

FIG. 5(h) illustrates a planar top view of a portion of semiconductor substrate wherein two interconnect lines of reduced geometry lie adjacent to one another. FIG. 5(h) is not drawn to the same scale as the planar side views of FIGS. 5(a)–5(g) to better demonstrate the increased device density resulting from the process of the invention. FIG. 5(h) shows two interconnect lines 580, 582 of reduced geometry. The interconnect lines 580, 582 do not have enlarged landing pads. For clarity purposes, a second insulating layer is not shown over the interconnect 580, 582. In FIG. 5(h), interconnect 582 is electrically linked to a contact 584 and to a second upper layer contact 586 (shown in ghost lines).

A disposable post process in accordance with the invention has thus been described. The example described in detail above electrically linked interconnect material to a contact wherein the interconnect material had extended from a filled contact. It is to be appreciated that the invention contemplates uses with all forms of interconnect processes, including the Damascene process. In uses with the Damascene process, the invention contemplates that the adjunct trench that contains the interconnect material is of reduced geometry with no enlarged landing pad.

The disposable post process in accordance with the invention may be used to create contacts with interconnect regions whereby the interconnect regions are fabricated to have a reduced geometry and no or minimal landing pad area. In this regard, the invention advantageously simplifies typical contact processes for semiconductor device fabrication by eliminating the need to use interconnects with enlarged landing pads to avoid over-etching the dielectric material underlying the interconnect and possibly contaminating the wafer. The elimination of enlarged interconnect landing pads also provides for decreased interconnect material spacing and increased device density.

While the invention has been described above for forming openings in insulative layers to provide for appropriate conductive connections to interconnects for various regions in a semiconductor wafer, it is to be appreciated that the disposable post process in accordance with the invention is not limited in use to forming openings in insulative or dielectric layers. Indeed, the invention may be used to form openings in other types of layers, for example metal layers or other conductive layers, in fabricating various semiconductor devices.

While the detailed description in accordance with the invention has been set forth above with regard to the best mode and preferred embodiment or embodiments contemplated by the inventor, it is to be appreciated that the invention is not limited to the above embodiment or embodiments and that various modifications may be made to the above embodiment or embodiments without departing from the broader spirit or scope of the invention as defined in the following claims. The specific embodiment or embodiments are, accordingly, to be regarded in an illustrative rather than a restrictive sense.

What is claimed is:

1. A method for forming an opening over an interconnect on a semiconductor wafer, comprising the steps of:
   (a) forming an interconnect without an enlarged landing pad;
   (b) forming a first layer having a first material over the interconnect;
   (c) patterning the layer of first material to form a post over the interconnect;
   (d) forming a second layer having a second material over the semiconductor wafer and around the post; and
   (e) removing the post to form an opening in the layer of second material over the interconnect.

2. The method of claim 1, wherein the first material comprises a photosensitive material.

3. The method of claim 1, wherein the first material comprises polysilicon.

4. The method of claim 1, further comprising the step of:
   (f) forming a third material in the opening in the layer of second material.

5. The method of claim 4, wherein the second material comprises an insulative material and wherein the third material comprises a conductive material.

6. The method of claim 1, wherein the patterning step (c) comprises the step of etching the first material to form the post.

7. The method of claim 1, wherein the forming step (d) includes the step of planarizing the layer of second material to form a planarized layer.

8. The method of claim 1, wherein the post removal step (e) comprises exposing a portion of the post in the layer of second material, and etching the post material with an etchant recipe.

9. The method of claim 8, wherein the etchant recipe for etching the post material is selective toward post material compared to the interconnect layer, the wafer, and the second layer.

10. The method of claim 7, wherein the post is exposed by polishing the planarized layer using a chemical-mechanical polish.

11. The method of claim 9, wherein the post is exposed by a melt-flow process.

12. The method of claim 7, wherein the post is exposed by etching a portion of the planarized layer to a point where the post is exposed.

13. A method for forming an opening over a semiconductor wafer having a region to be contacted of reduced geometry, comprising the steps of:
   (a) forming a region to be contacted of reduced geometry without an enlarged region;
   (b) forming a layer of a first material over the semiconductor wafer;
   (c) patterning the layer of first material to form a post over at least a portion of the region to be contacted;
   (d) forming a layer of insulative material over the semiconductor wafer and around the post;
   (e) removing the post to form an opening in the layer of insulative material over at least the portion of the region to be contacted; and
   (f) forming a conductive material in the opening in the layer of insulative material to contact the region.

14. The method of claim 13, wherein the first material comprises a photosensitive material.

15. The method of claim 13, wherein the first material comprises polysilicon.

16. The method of claim 13, wherein the patterning step (c) comprises the step of etching the first material to form the post.

17. The method of claim 13, wherein the forming step (d) includes the step of planarizing the layer of insulative material to form a planarized layer.

18. The method of claim 13, wherein the post removal step (e) comprises exposing a portion of the post in the layer of second material, and etching the post material with an etchant recipe.

19. The method of claim 18, wherein the etchant recipe for etching the post material is selective toward post material compared to the region to be connected, the wafer, and the insulative material.

20. The method of claim 17, wherein the post is exposed by polishing the planarized layer using a chemical-mechanical polish.

21. The method of claim 19, wherein the post is exposed by a melt-flow process.

22. The method of claim 17, wherein the post is exposed by etching a portion of the planarized layer to a point where the post is exposed.

* * * * *